United States Patent
Sugibayashi et al.

(10) Patent No.: US 9,379,312 B2
(45) Date of Patent: Jun. 28, 2016

(54) MAGNETORESISTIVE EFFECT ELEMENT AND MAGNETIC RANDOM ACCESS MEMORY USING THE SAME

(75) Inventors: Tadahiko Sugibayashi, Tokyo (JP); Eiji Kariyada, Tokyo (JP); Kaoru Mori, Tokyo (JP); Norikazu Ohshima, Tokyo (JP); Shunsuke Fukami, Tokyo (JP); Tetsuhiro Suzuki, Tokyo (JP); Hironobu Tanigawa, Tokyo (JP); Sadahiko Miura, Tokyo (JP); Nobuyuki Ishiwata, Tokyo (JP)

(73) Assignee: NEC CORPORATION, Tokyo (JP)

( * ) Notice: Subject to any disclaimer, the term of this patent is extended or adjusted under 35 U.S.C. 154(b) by 72 days.

(21) Appl. No.: 13/518,974

(22) PCT Filed: Dec. 14, 2010

(86) PCT No.: PCT/JP2010/072494
§ 371 (c)(1),
(2), (4) Date: Jan. 10, 2013

(87) PCT Pub. No.: WO2011/078018
PCT Pub. Date: Jun. 30, 2011

(65) Prior Publication Data
US 2013/0175645 A1 Jul. 11, 2013

(30) Foreign Application Priority Data
Dec. 24, 2009 (JP) .................................. 2009-292171

(51) Int. Cl.
*H01L 29/82* (2006.01)
*H01L 43/02* (2006.01)
(Continued)

(52) U.S. Cl.
CPC ................. *H01L 43/02* (2013.01); *B82Y 25/00* (2013.01); *G11C 11/14* (2013.01); *G11C 11/161* (2013.01);
(Continued)

(58) Field of Classification Search
CPC ......... H01L 43/02; H01L 43/08; H01L 43/10; G11C 11/15
USPC .......................... 257/421; 365/158; 360/324.2
See application file for complete search history.

(56) References Cited

U.S. PATENT DOCUMENTS 6,834,005 B1  12/2004  Parkin
7,663,197 B2   2/2010  Nagase et al.
(Continued)

FOREIGN PATENT DOCUMENTS

JP   2005-191032   7/2005
JP   2007-142364   6/2007
(Continued)

OTHER PUBLICATIONS

G.H.O. Daalderop et al., "Prediction and Confirmation of Perpendicular Magnetic Anisotropy in Co/Ni Multilayers", Physical Review Letters, vol. 68, No. 5, pp. 682-685, Feb. 3, 1992.
(Continued)

*Primary Examiner* — Moazzam Hossain
(74) *Attorney, Agent, or Firm* — Young & Thompson

(57) ABSTRACT

A magnetoresistive effect element of the present invention includes: a domain wall motion layer, a spacer layer and a reference layer. The domain wall motion layer is made of ferromagnetic material with perpendicular magnetic anisotropy. The spacer layer is formed on the domain wall motion layer and made of non-magnetic material. The reference layer is formed on the spacer layer and made of ferromagnetic material, magnetization of the reference layer being fixed. The domain wall motion layer includes at least one domain wall, and stores data corresponding to a position of the domain wall. An anisotropy magnetic field of the domain wall motion layer is larger than a value in which the domain wall motion layer can hold the perpendicular magnetic anisotropy, and smaller than an essential value of an anisotropy magnetic field of the ferromagnetic material of the domain wall motion layer.

9 Claims, 6 Drawing Sheets

(51) Int. Cl.
*B82Y 25/00* (2011.01)
*G11C 11/14* (2006.01)
*H01F 10/32* (2006.01)
*H01L 43/08* (2006.01)
*H01L 43/10* (2006.01)
*G11C 11/16* (2006.01)
*G11C 19/08* (2006.01)
*H01L 27/22* (2006.01)

(52) U.S. Cl.
CPC ........ *G11C 19/0808* (2013.01); *G11C 19/0841* (2013.01); *H01F 10/3254* (2013.01); *H01F 10/3286* (2013.01); *H01L 27/228* (2013.01); *H01L 43/08* (2013.01); *H01L 43/10* (2013.01); *G11C 2213/74* (2013.01); *G11C 2213/79* (2013.01); *H01F 10/3295* (2013.01)

(56) References Cited

U.S. PATENT DOCUMENTS

| | | | |
|---|---|---|---|
| 8,036,025 | B2 | 10/2011 | Nagase et al. |
| 8,363,462 | B2 | 1/2013 | Nagase et al. |
| 2001/0013999 | A1* | 8/2001 | Koi et al. .................. 360/324.11 |
| 2002/0008016 | A1* | 1/2002 | Hayashi et al. ............. 204/192.1 |
| 2004/0165425 | A1* | 8/2004 | Nakamura ............ G11C 11/15 365/171 |
| 2006/0221677 | A1* | 10/2006 | Klaeui et al. .................. 365/158 |
| 2006/0237808 | A1* | 10/2006 | Saito ............................ 257/421 |
| 2007/0014149 | A1* | 1/2007 | Nagamine ............ G11C 11/15 365/158 |
| 2007/0086121 | A1* | 4/2007 | Nagase et al. ............. 360/324.1 |
| 2009/0015958 | A1* | 1/2009 | Nakamura et al. ............. 360/55 |
| 2009/0296462 | A1* | 12/2009 | Kent ...................... G11C 11/16 365/171 |
| 2010/0109111 | A1* | 5/2010 | Shin et al. ...................... 257/421 |
| 2010/0330395 | A1* | 12/2010 | Zhang et al. .................. 428/813 |
| 2011/0051295 | A1* | 3/2011 | Hara et al. .................... 360/324 |
| 2011/0073970 | A1* | 3/2011 | Kai et al. ...................... 257/421 |
| 2011/0170339 | A1* | 7/2011 | Wunderlich ....... G11C 11/1675 365/158 |
| 2012/0068279 | A1* | 3/2012 | Lai et al. ...................... 257/421 |

FOREIGN PATENT DOCUMENTS

| | | |
|---|---|---|
| JP | 2009-252909 | 10/2009 |
| WO | WO 2009/001706 | 12/2008 |

OTHER PUBLICATIONS

F.J.A. den Broeder et al., "Perpendicular Magnetic Anisotropy and Coercivity of Co/Ni Multilayers", IEEE Transactions on Magnetics, vol. 28, No. 5, pp. 2760-2765, Sep. 1992.

S. Fukami et al., "Micromagnetic analysis of current driven domain wall motion in nanostrips with perpendicular magnetic anisotropy", Journal of Applied Physics, vol. 103, pp. 07E718-1 to 07E718-3, 2008.

N. Sakimura et al., "MRAM Cell Technology for Over 500-MHz SoC", IEEE Journal of Solid-State Circuits, vol. 42, No. 4, pp. 830-838, Apr. 2007.

T. Suzuki et al., "Evaluation of Scalability for Current-Driven Domain Wall Motion in a Co/Ni Multilayer Strip for Memory Applications", IEEE Transactions on Magnetics, vol. 45, No. 10, pp. 3776-3779, Oct. 2009.

A. Thiaville et al., "Domain wall motion by spin-polarized current: a micromagnetic study", Journal of Applied Physics, vol. 95, No. 11, pp. 7049-7051, Jun. 1 2004.

A. Yamaguchi et al., "Real-Space Observation of Current-Driven Domain Wall Motion in Submicron Magnetic Wires", Physical Review Letters, vol. 92, No. 7, pp. 077205-1 to 077205-4, Feb. 20, 2004.

International Search Report, PCT/JP2010/072494, Mar. 8, 2011.

Japanese Office Action dated Feb. 26, 2014 in corresponding Japanese Patent Application No. 2011-547488 with partial English translation of Japanese Office Action.

* cited by examiner

Fig. 6

| | DOMAIN WALL MOTION LAYER | UNDERLAYER | Hk (kOe) | CURRENT (mA) |
|---|---|---|---|---|
| EXAMPLE 1 | [Co(0.3)/Ni(0.6)]5 | Ta(4)/Pt(1.6) | 14.3 | 0.4 |
| COMPARISON EXAMPLE 1 | [Co(0.3)/Ni(0.6)]5 | Ta(4)/Pt(2.4) | 15.2 | 0.7 |

Fig. 7

| | DOMAIN WALL MOTION LAYER | UNDERLAYER | Hk (kOe) | CURRENT (mA) |
|---|---|---|---|---|
| EXAMPLE 2 | [Co(0.3)/Ni(0.6)]5 | Ta(4)/Pt(1) | 11.4 | 0.4 |
| COMPARISON EXAMPLE 2 | [Co(0.3)/Ni(0.6)]5 | Ta(4)/Pt(1.6) | 15.4 | 0.8 |

Fig. 8

| | DOMAIN WALL MOTION LAYER | CAP LAYER | Hk (kOe) | CURRENT (mA) |
|---|---|---|---|---|
| EXAMPLE 3 | [Co(0.3)/Ni(0.6)]5 | Ru(2.0) | 13.4 | 0.3 |
| EXAMPLE 4 | [Co(0.3)/Ni(0.6)]5 | Pt(2.0) | 14.3 | 0.4 |
| COMPARISON EXAMPLE 3 | [Co(0.3)/Ni(0.6)]5 | MgO(1.0) | 15.7 | 0.8 |

MAGNETORESISTIVE EFFECT ELEMENT AND MAGNETIC RANDOM ACCESS MEMORY USING THE SAME

TECHNICAL FIELD

The present invention relates to a magnetoresistive effect element and a magnetic random access memory using the same.

BACKGROUND ART

A magnetic memory, especially a magnetic random access memory (MRAM) is a nonvolatile memory capable of a high-speed operation and rewriting of an infinite number of times. Therefore, some types of MRAMs have been put into practical use, and some types of MRAMs have been developing to improve their general versatility. In the MRAM, magnetic material is used for a memory element, and data is stored in the memory element as a magnetization direction of the memory element. To write desired data to the memory element, the magnetization direction of the magnetic material is made to be switched to a direction corresponding to the data. Some methods for switching the magnetization direction of the memory element are proposed. Those methods have in common with usage of a current (hereinafter referred to as writing current. To put a MRAM into practical use, it is important to reduce the writing current as much as possible.

According to the non-patent literature 1 (N. Sakimura et al., "MRAM Cell Technology for Over 500-MHz SoC", IEEE Journal of Solid-State Circuits, vol. 42, p. 830-838, 2007), by reducing the wiring current equal to or less than 0.5 mA, its cell area can be equivalent to that of the existing embedded SRAM.

The most general method of writing data in a MRAM is to switch a magnetization direction of a magnetic memory element by a magnetic field which is generated by passing current through a wiring line for a writing operation prepared on the periphery of the magnetic memory element. According to this method, since the MRAM can theoretically perform writing at a speed of 1 nano-second or less, the MRAM is suitable for a high-speed MRAM. However, a magnetic field for switching magnetization of magnetic material securing thermal stability and resistance against external disturbance magnetic field is generally a few dozens of [Oe]. In order to generate such magnetic field, a writing current of about a few mA is needed. In this case, a chip area is necessarily large and power consumed for writing increases. Therefore, this MRAM is not competitive with other kinds of random access memories. In addition, when a size of a memory cell is miniaturized, a writing current further increases and is not scaling, which is not preferable.

Recently, as methods to solving these problems, following two methods are proposed.

The first method is a spin torque transfer method. According to the s spin torque transfer method, in a lamination layer including a first magnetic layer which has magnetization that can be switched, and a second magnetic layer which is electrically connected to the first magnetic layer and has magnetization that is fixed, writing current flows between the second magnetic layer and the first magnetic layer. Here, by using an interaction between spin-polarized conduction electrons and localized electrons in the first magnetic layer, the magnetization in the first magnetic layer can be switched. A reading operation is carried out by using a magnetoresistive effect generated between the first magnetic layer and the second magnetic layer. Therefore, the magnetic memory element using the spin torque transfer is an element having two terminals. The spin torque transfer is generated when a current density is equal to or more than a certain value. Accordingly, as the size of the element decreases, the writing current is also reduced. In other words, the spin torque transfer is excellent in scaling performance. However, generally, an insulating film is provided between the first magnetic layer and the second magnetic layer and relatively large current should be made to flow through the insulating film in the writing operation. Thus, there are problems regarding resistance to rewriting and reliability. In addition, there is concern that a writing error occurs in the reading operation because a current path of the writing operation is the same as that of the reading operation. As mentioned above, although the spin torque transfer is excellent in scaling performance, there are some obstacles to put it into practical use.

The second method is a current driven domain wall motion method. A MRAM using the current driven domain wall motion is disclosed in the patent literature 1 (Japanese patent publication JP2005-191032A). In a general MRAM using the current driven domain wall motion, a magnetic layer (a domain wall motion layer in which data is stored) having magnetization which can be switched is provided, and magnetization of both end portions of the domain wall motion layer is fixed such that the magnetization of one end portion is approximately anti-parallel to that of the other end portion. By providing such a magnetization arrangement, a domain wall is introduced into the domain wall motion layer. Here, as reported in the non-patent literature 2 (A. Yamaguchi et al., "Real-Space Observation of Current-Driven Domain Wall Motion in Submicron Magnetic Wires", Physical Review Letters, vol. 92, p. 077205, 2004), when current flows in a direction passing through the domain wall, the domain wall moves in a direction which is the same as that of the conduction electrons. Therefore, by making writing current flow in an in-plane direction in the domain wall motion layer, the domain wall is made to move in a direction corresponding to the current direction, thereby enable to write desired data in the domain wall motion layer. When data is read, by using a magnetic tunnel junction including a region where the domain wall moves, the data reading is performed based on the magnetoresistive effect. Therefore, the magnetic memory element using the current driven domain wall motion method is an element having three terminals. Similar to the spin torque transfer, the current driven domain wall motion arises, when the current density is equal to or more than a certain value. Thus, the current driven domain wall motion method is also excellent in scaling performance. In addition, in the current driven domain wall motion method, the writing current does not flow through the insulating layer and the current path of the writing operation is different from that of the reading operation. Consequently, the above-mentioned problems caused in the spin torque transfer can be solved.

Meanwhile, the non-patent literature 2 discloses that a current density of approximately $1 \times 10^8$ A/cm$^2$ is required for the current driven domain wall motion.

The non-patent literature 3 (S. Fukami et al., "Micromagnetic analysis of current driven domain wall motion in nanostrips with perpendicular magnetic anisotropy", Journal of Applied Physics, vol. 103, p. 07E718, 2008) discloses usefulness of magnetic material having perpendicular magnetic anisotropy in the current driven domain wall motion method. Specifically, according to the micromagnetic simulation, if the domain wall motion layer where the domain wall motion arises has perpendicular magnetic anisotropy, the writing current can be sufficiently reduced.

The patent literature 3 (International Publication WO/2009/001706) discloses that a magnetoresistive effect element using magnetic material with perpendicular magnetic anisotropy and a MRAM using it for a memory cell. FIG. 1 is a sectional view schematically showing a magnetoresistive effect element in the International Publication WO/2009/001706. The magnetoresistive effect element 170 includes a domain wall motion layer 110, a spacer layer 120 and a reference layer 130.

The domain wall motion layer 110 is composed of ferromagnetic material with perpendicular magnetic anisotropy. The domain wall motion layer 110 includes a first magnetization fixed region 111a, a second magnetization fixed region 111b and a magnetization free region 113. The magnetization fixed regions 111a, 111b are arranged on the both sides of the magnetization free region 113. The magnetization directions of the magnetization fixed regions 111a, 111b are fixed opposite (anti-parallel) to each other. For example, as shown in FIG. 1, the magnetization direction of the first magnetization fixed region 111a is fixed in the +z direction, and the magnetization direction of the second magnetization fixed region 111b is fixed in the −z direction. Meanwhile, the magnetization direction of the magnetization free region 113 can be reversed by writing current flowing from one of the magnetization fixed regions 111a, 111b to the other and becomes the +z direction or the −z direction. Therefore, based on the magnetization direction of the magnetization free region 113, a domain wall 112a or a domain wall 112b is formed inside the domain wall motion layer 110. Data is stored as the magnetization direction of the magnetization free region 113. It can be seen that data is stored as the position of the domain wall 112 (112a or 112b). The reference layer 130 which is made of ferromagnetic material and whose magnetization direction is fixed, the spacer layer 120 which is a non-magnetic layer (an insulating layer) and the magnetization free region 113 constitute a magnetic tunnel junction (MTJ). Data can be read as the magnitude of a resistance value of the MTJ The patent literature 3 discloses that writing current can be reduced if the domain wall motion layer 110 has perpendicular magnetic anisotropy.

CITATION LIST

Patent Literatures

[PTL 1] JP2005-191032A
[PTL 2] U.S. Pat. No. 6,834,005B1
[PTL 3] WO/2009/001706A

Non Patent Literatures

[NPL 1] N. Sakimura et al., "MRAM Cell Technology for Over 500-MHz SoC", IEEE Journal of Solid-State Circuits, vol. 42, p. 830-838, (2007).
[NPL 2] A. Yamaguchi et al., "Real-Space Observation of Current-Driven Domain Wall Motion in Submicron Magnetic Wires", Physical Review Letters, vol. 92, p. 077205 (2004).
[NPL 3] S. Fukami et al., "Micromagnetic analysis of current driven domain wall motion in nanostrips with perpendicular magnetic anisotropy", Journal of Applied Physics, vol. 103, p. 07E718 (2008).
[NPL 4] A. Thiaville et al., "Domain wall motion by spin-polarized current: a micromagnetic study", JOURNAL OF APPLIED PHYSICS, VOL. 95, NO. 11, pp. 7049-7051, (2004).
[NPL 5] G. H. O. Daalderop et al., "Prediction and Confirmation of Perpendicular Magnetic Anisotropy in Co/Ni Multilayers", PHYSICAL REVIEW LETTERS, VOL. 68, NO. 5, pp. 682-685, (1992).
[NPL 6] T. Suzuki et al., "Evaluation of Scalability for Current-Driven Domain Wall Motion in a Co/Ni Multilayer Strip for Memory Applications", IEEE TRANSACTIONS ON MAGNETICS, VOL. 45, NO. 10, pp. 3776-3779, (2009).

SUMMARY OF INVENTION

As disclosed in the non patent literature 3, the patent literature 3 and the like described above, when a domain wall motion layer has perpendicular magnetic anisotropy, in the domain wall motion layer, writing current which is smaller than writing current of other methods can move a domain wall.

Here, the inventor has now considered the following points. That is, the inventor has considered that when the domain wall motion layer is made of ferromagnetic material with perpendicular magnetic anisotropy, if a spin polarizability of the domain wall motion layer is made larger than before, the writing current can be smaller than before. That is, by finding out the relationship between the spin polarizability and the perpendicular magnetic anisotropy (anisotropy magnetic field) in the domain wall motion layer and providing optimal perpendicular magnetic anisotropy (anisotropy magnetic field) for the domain wall motion layer to make the spin polarizability larger than before, the writing current can be smaller than before. An object of the present invention is to provide, in a magnetoresistive effect element to which a current driven domain wall motion is applied and a MRAM using the same, a domain wall motion layer with perpendicular magnetic anisotropy which can operate by using writing current smaller than before.

A magnetoresistive effect element of the present invention includes: a domain wall motion layer, a spacer layer and a reference layer. The domain wall motion layer is made of ferromagnetic material with perpendicular magnetic anisotropy. The spacer layer is formed on the domain wall motion layer and made of non-magnetic material. The reference layer is formed on the spacer layer and made of ferromagnetic material, magnetization of the reference layer being fixed. The domain wall motion layer includes at least one domain wall, and stores data corresponding to a position of the domain wall. An anisotropy magnetic field of the domain wall motion layer is larger than a value in which the domain wall motion layer can hold the perpendicular magnetic anisotropy, and smaller than an essential value of an anisotropy magnetic field of the ferromagnetic material of the domain wall motion layer.

A magnetoresistive effect element of the present invention includes: a domain wall motion layer, a spacer layer and a reference layer. The domain wall motion layer is formed of a first lamination film composed of a Co film and a Ni film with perpendicular magnetic anisotropy. The spacer layer is formed on the domain wall motion layer and made of non-magnetic material. The reference layer is formed on the spacer layer and made of ferromagnetic material, magnetization of the reference layer being fixed. The domain wall motion layer includes at least one domain wall, and stores data corresponding to a position of the domain wall. An anisotropy magnetic field of the domain wall motion layer is larger than 8 kOe and smaller than 15 kOe.

A magnetic random access memory of the present invention includes magnetoresistive effect elements according to any of the above paragraphs provided for magnetic memory cells.

According to the present invention, in a magnetoresistive effect element to which a current driven domain wall motion is applied and a MRAM using the same, a domain wall motion layer with perpendicular magnetic anisotropy which can operate by using writing current smaller than before can be suitably realized.

BRIEF DESCRIPTION OF DRAWINGS

FIG. 6 is a table showing a first example and its comparison example 1 of the present invention;

FIG. 7 is a table showing a second example and its comparison example 2 of the present invention;

FIG. 8 is a table showing a third and fourth examples and their comparison example 3 of the present invention.

DESCRIPTION OF EXEMPLARY EMBODIMENTS

Exemplary embodiments of a magnetoresistive effect element of a current driven domain wall motion and a magnetic random access memory using the same according to the present invention will be described below with reference to the accompanying drawings.

First, a structure of the magnetoresistive effect element according to the exemplary embodiment of the present invention will be described.

Figure 2:
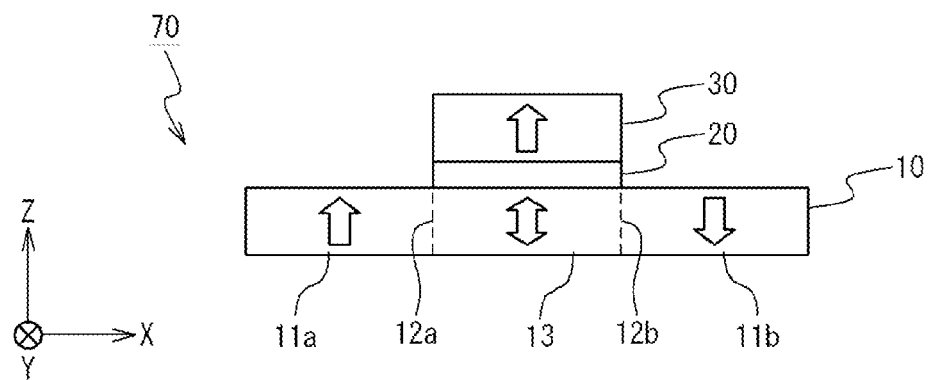
FIG. 2 is a schematic sectional view showing a structure of a magnetoresistive effect element according to an exemplary embodiment of the present invention.

FIG. 2 is a schematic sectional view showing a structure of the magnetoresistive effect element according to the exemplary embodiment of the present invention. The magnetoresistive effect element 70 includes a domain wall motion layer 10, a spacer layer 20 and a reference layer 30.

The domain wall motion layer 10 is made of ferromagnetic material with perpendicular magnetic anisotropy. The domain wall motion layer 10 includes a region in which a magnetization direction can be reversed, and stores data corresponding to the magnetization state. In detailed, the domain wall motion layer 10 includes a first magnetization fixed region 11a, a second magnetization fixed region 11b and a magnetization free region 13.

The magnetization fixed regions 11a and 11b are provided adjacent to the magnetization free layer 13, respectively. The magnetization directions of the magnetization fixed regions 11a and 11b are fixed opposite (anti-parallel) to each other. In the example of FIG. 2, the magnetization direction of the first magnetization fixed region 11a is fixed in the +z direction and the magnetization direction of the second magnetization fixed region 11b is fixed in the −z direction. As the magnetization fixing method, for example, the following is considered that hard layers (not shown) whose magnetization directions are fixed in the +z/−z directions are provided adjacent to the magnetization fixed regions 11a and 11b, respectively.

The magnetization direction of the magnetization free region 13 can be reversed and can take any of the +z direction and the −z direction. Therefore, a domain wall 12 (12a or 12b) is formed in the first domain wall motion layer 10 depending on the magnetization direction of the magnetization free region 13. In the example of FIG. 2, when the magnetization direction of the magnetization free region 13 is the +z direction, the domain wall 12b is formed between the magnetization free region 13 and the second magnetization fixed region 11b. On the other hand, when the magnetization direction of the magnetization free region 13 is the −z direction, the domain wall 12a is formed between the magnetization free region 13 and the first magnetization fixed region 11a. That is, the domain wall motion layer 10 has at least one domain wall 12 (12a or 12b), and the position of the domain wall 12 corresponds to the magnetization direction of the magnetization free region 13.

The spacer layer 20 is provided adjacent to the domain wall motion layer 10. Specifically, the spacer layer 20 is provided adjacent to at least the magnetization free layer 13 of the domain wall motion layer 10. The spacer layer 20 is made of non-magnetic material. Preferably, it is made of insulating material.

The reference layer 30 is provided adjacent to the spacer layer 20 and on the side opposite to the domain wall motion layer 10. That is to say, the reference layer 30 is connected to the domain wall motion layer 10 (the magnetization free region 13) through the spacer layer 20. The reference layer 30 is made of ferromagnetic material and its magnetization direction is fixed in one direction. Preferably, similar to the domain wall motion layer 10, the reference layer 30 is also made of ferromagnetic material with perpendicular magnetic anisotropy. In this case, the magnetization direction of the reference layer 30 is fixed in the +z direction or the −z direction. In the example of FIG. 2, the magnetization direction of the reference layer 30 is the +z direction.

The domain wall motion layer 10 (the magnetization free region 13), the spacer layer 20 and the reference layer 30 described above constitute a magnetic tunnel junction (MTJ). That is, the domain wall motion layer 10 (the magnetization free region 13), the spacer layer 20 and the reference layer 30 correspond to a free layer, a barrier layer and a pin layer of the MTJ.

Incidentally, electrode layers (not shown) are electrically connected to the both ends of the domain wall motion layer 10, respectively. Specifically, two electrode layers (not shown) are provided so as to be connected to the magnetization fixed regions 11a and 11b, respectively. These electrodes are used for introducing the writing current into the domain wall motion layer 10. These electrodes can be connected to the both ends of the domain wall motion layer 10 through the above-described hard layers, respectively. In addition, another electrode (not shown) is electrically connected to the reference layer 30.

Next, data storage states of the magnetoresistive effect element according to the exemplary embodiment of the present invention will be described.

Here, it is described with reference to the example of FIG. 2. It is assumed that the magnetization directions of the magnetization fixed regions 11a and 11b of the domain wall motion layer 10 are fixed in the +z direction and the −z direction, respectively, and the magnetization direction of the reference layer 30 is fixed in the +z direction.

In the example of FIG. 2, in the case that the magnetization direction of the magnetization free region 13 of the domain wall motion layer 10 is the +z direction, the domain wall 12b is formed at the boundary between the magnetization free region 13 and the second magnetization fixed region 11b. In addition, the magnetization direction of the magnetization free region 13 and the magnetization direction of the reference layer 30 are parallel to each other. Therefore, a resistance value of the MTJ is relatively small. This magnetization state can be related to, for example, a storage state of the data "0".

On the other hand, in FIG. 2, in the case that the magnetization direction of the magnetization free region 13 of the domain wall motion layer 10 is the −z direction, the domain wall 12a is formed at the boundary between the magnetization free region 13 and the first magnetization fixed region 11a. In addition, the magnetization direction of the magnetization free region 13 and the magnetization direction of the reference layer 30 are anti-parallel to each other. Therefore, the resistance value of the MTJ is relatively large. This magnetization state can be related to, for example, a storage state of the data "1".

In this way, corresponding to the magnetization states of the domain wall motion layer 10, that is, the domain wall positions in the first domain wall motion layer 10, the two storage states can be realized. Here, the relationship between the magnetization states and the two storage states defined in the above description are arbitrary. That is, the domain wall motion layer 10 has at least one domain wall 12 (12a or 12b), the position of the domain wall 12 corresponds to the magnetization direction of the magnetization free region 13. Therefore, the domain wall motion layer 10 stores data which corresponds to the position of the domain wall 12.

A method of writing data in the magnetoresistive effect element according to the exemplary embodiment of the present invention will be described with reference to FIG. 2.

In the data "0" state (where the magnetization directions of the magnetization free region 13 and the reference layer 30 are parallel to each other), the method of writing the data "1" state (anti-parallel to each other) will be described. In this case, the writing current is made to flow from the first magnetization fixed region 11a to the second magnetization fixed region 11b through the magnetization free region 13. Conduction electrons flow from the second magnetization fixed region 11b to the first magnetization fixed region 11a through the magnetization free region 13. In this case, the spin transfer torque (STT) works on the domain wall 12b located near the boundary between the second magnetization fixed region 11b and the magnetization free region 13. Thus, the domain wall 12b moves toward the first magnetization fixed region 11a. That is, the current driven domain wall motion arises. Since the writing current (density) decreases at the side of the first magnetization fixed region 11a from the boundary between the first magnetization fixed region 11a and the magnetization free region 13, the domain wall 12 stops its motion near the boundary. In this way, the domain wall 12a moves near the boundary between the first magnetization fixed region 11a and the magnetization free region 13 and thus the writing of the data "1" is achieved.

Next, in the data "1" state (where the magnetization directions of the magnetization free region 13 and the reference layer 30 are anti-parallel to each other), the method of writing the data "0" state (parallel to each other) will be described. In this case, the writing current is made to flow from the second magnetization fixed region 11b to the first magnetization fixed region 11a through the magnetization free region 13. Conduction electrons flow from the first magnetization fixed region 11a to the second magnetization fixed region 11b through the magnetization free region 13. In this case, the spin transfer torque works on the domain wall 12a located near the boundary between the first magnetization fixed region 11a and the magnetization free region 13. Thus, the domain wall 12a moves toward the second magnetization fixed region 11b. That is, the current driven domain wall motion arises. Since the writing current (density) decreases at the side of the second magnetization fixed region 11b from the boundary between the second magnetization fixed region 11b and the magnetization free region 13, the domain wall 12 stops its motion near the boundary. In this way, the domain wall 12b moves near the boundary between the second magnetization fixed region 11b and the magnetization free region 13 and thus the writing of the data "0" is achieved.

Incidentally, when the data "0" writing is performed in the data "0" state and the data "1" writing is performed in the data "1" state, the states are not changed. That is, overwriting can be performed.

A method of reading data in the magnetoresistive effect element according to the exemplary embodiment of the present invention will be described with reference to FIG. 2.

In the present exemplary embodiment, the data reading can be performed using the tunneling magnetoresistive effect (TMR effect). For that purpose, the reading current flows in the direction passing through the MTJ (the magnetization free region 13 of the domain wall motion layer 10, the spacer layer 20 and the reference layer 30).

Incidentally, the direction of the reading current is arbitrary. Here, in the case that the magnetoresistive effect element 70 is in the data "0" state, the resistance value of the MTJ is relatively small. In the case that the magnetoresistive effect element 70 is in the data "1" state, the resistance value of the MTJ is relatively large. Therefore, the data can be read by detecting the resistance value.

Next, a magnetic memory cell including the magnetoresistive effect element 70 according to the present exemplary embodiment will be described.

Figure 3:
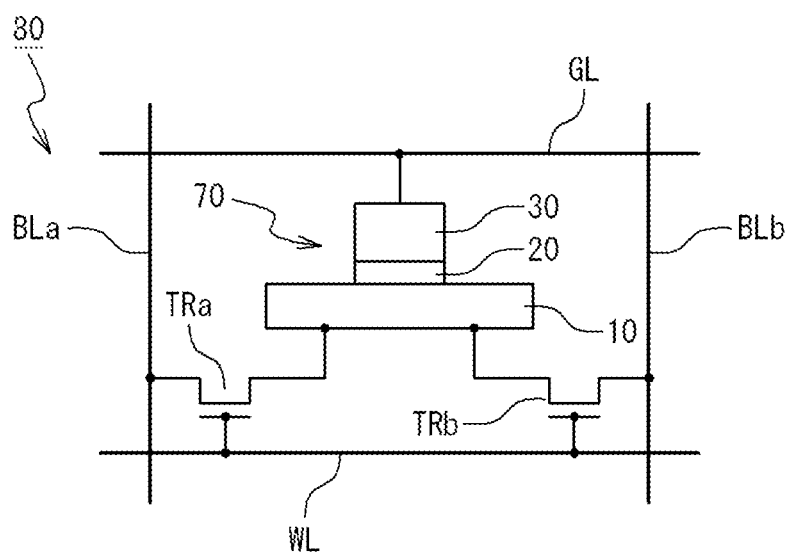
FIG. 3 is a schematic circuit diagram showing a structure example of a magnetic memory cell 80 of 1-bit according to the exemplary embodiment of the present invention.

FIG. 3 is a schematic circuit diagram showing a structure example of the magnetic memory cell 80 of 1-bit according to the exemplary embodiment of the present invention. The magnetic memory cell 80 has a 2T–1MTJ (2 transistors–1 magnetic tunnel junction) structure which includes the magnetic memory element 70 and two transistors TRa and TRb. The magnetoresistive effect element 70 is a three-terminal element and connected to a word line WL, a ground line GL and a bit line pair BLa and BLb. For example, a terminal connected to the reference layer 30 is connected to the ground line GL. A terminal connected to the first magnetization fixed region 11a of the domain wall motion layer 10 is connected to the bit line BLa through the transistor TRa. A terminal connected to the second magnetization fixed region 11b of the domain wall motion layer 10 is connected to the bit line BLb through the transistor TRb. The gates of the transistors TRa and TRb are connected to the common word line WL.

In the writing operation, the word line WL is set in the High level and the transistors TRa and TRb are turned on. In addition, one of the bit lines BLa and BLb is set in the High level and the other is set in the Low level (Ground level). As a result, the writing current flows between the bit line BLa and the bit line BLb through the transistors TRa and TRb and the domain wall motion 10.

In the reading operation, the word line WL is set in the High level and the transistors TRa and TRb are turned on. In addition, the bit line BLa is set in the open state and the bit line BLb is set in the High level. As a result, the reading current Iread flows from the bit line BLb to the ground line GL through the MTJ of the magnetoresistive effect element 70.

Next, a circuit structure of a magnetic random access memory 90 according to the exemplary embodiment of the present invention will be described.

Figure 4:
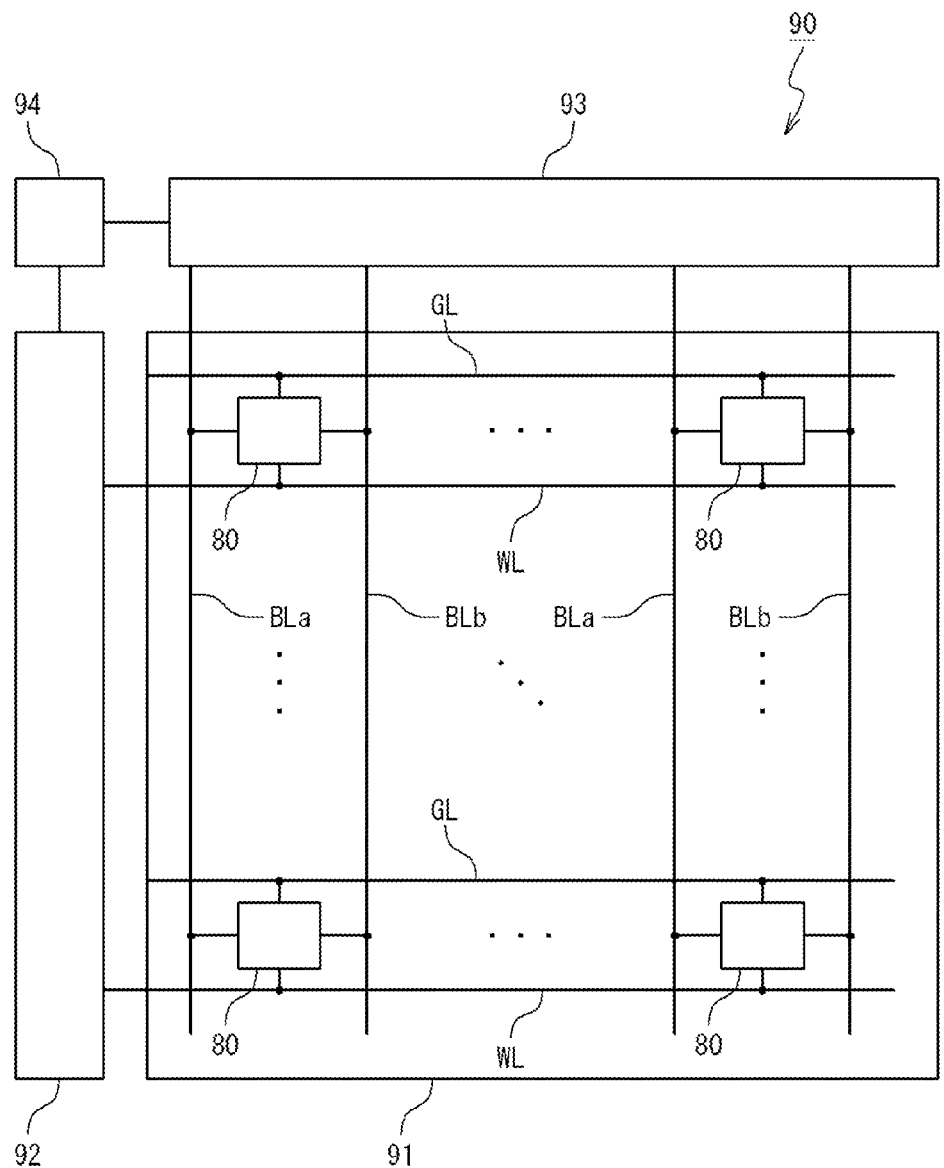
FIG. 4 is a block diagram showing a structure example of a magnetic random access memory 90 according to the exemplary embodiment of the present invention.

FIG. 4 is a block diagram showing a structure example of the magnetic random access memory 90 according to the exemplary embodiment of the present invention. The magnetic random access memory 90 includes a memory cell array 91, an X driver 92, a Y driver 93 and a controller 94. The memory cell array 91 includes a plurality of the magnetic memory cells 80 arranged in an array. As described in FIG. 3, each magnetic memory cell 80 is connected to the word line WL, the ground line GL and the bit line pair BLa and BLb. The X driver 92 is connected to a plurality of the word lines WL and drives a selection word line, which is connected to an access target magnetic memory cell 80, in the plurality of the word lines WL. The Y driver 93 is connected to a plurality of the bit line pairs BLa and BLb and sets each bit line in the state corresponding to the writing operation or the reading operation. The controller 94 controls the X driver 92 and the Y driver 93 based on the writing operation or the reading operation.

Next, material and a structure of the domain wall motion layer of the magnetoresistive effect element 70 according to the exemplary embodiment of the present invention will be described.

As disclosed in the non-patent literature 3, the patent literature 3 and the like, in the case that the domain wall motion layer has perpendicular magnetic anisotropy, the writing current smaller than that of other method can cause the domain wall motion in the domain wall motion layer. According to the non-patent literature 4 (A. Thiaville et al., "Domain wall motion by spin-polarized current: a micromagnetic study", JOURNAL OF APPLIED PHYSICS, VOL. 95, NO. 11, pp. 7049-7051, 2004), the larger the parameter $g\mu_B P/2eM_s$ is, the easier the current driven domain wall motion arises. Here, g is the Lande g-factor, $\mu_B$ is the Bohr magneton, P is the spin polarizability, e is the elementary electric charge and $M_s$ is the saturation magnetization. Here, since g, $\mu_B$ and e are the physical constants, it is effective that the spin polarizability P of the domain wall motion layer 10 is made large, and the saturation magnetization $M_s$ is made small in order to reduce the writing current.

In light of the saturation magnetization, the alternate lamination films of transition metal systems such as Co/Ni, Co/Pt, Co/Pd, CoFi/Ni, CoFe/Pt, CoFe/Pd and so on are promising as the domain wall motion layer 10. It is known that the saturation magnetization of such material is relatively small. If the alternate lamination film of transition metal systems is generalized further, the first domain wall motion layer 10 has a lamination structure in which a first layer and a second layer are laminated. The first layer contains: any of Fe, Co and Ni, or an alloy composed of a plurality of material selected from the group of them. The second layer contains: any of Pt, Pd, Au, Ag, Ni and Cu, or an alloy composed of a plurality of material selected from the group of them.

In the above-described lamination film, particularly, Co/Ni has the very high spin polarizability. Therefore, the Co/Ni lamination layer is particularly preferable for the domain wall motion layer 10. In fact, the inventor confirmed, by the experiment, that high controllable domain wall motion can be realized by using Co/Ni.

Incidentally, magnetic material of the domain wall motion layer 10 as described above has a fcc (111) orientation crystal structure which is a fcc structure and in which (111) planes are laminated in the direction perpendicular to the substrate. According to the non-patent literature 5 (G. H. O. Daalderop et al., "Prediction and Confirmation of Perpendicular Magnetic Anisotropy in Co/Ni Multi layers", PHYSICAL REVIEW LETTERS, VOL. 68, NO. 5, pp. 682-685, 1992), the perpendicular magnetic anisotropy of the lamination film as described above is caused by the boundary magnetic anisotropy at the boundaries between the films in the lamination film. Therefore, to realize the excellent perpendicular magnetic anisotropy in the domain wall motion layer 10, an "underlayer" on which the above-described magnetic material with the excellent fcc (111) orientation can be grown is preferably provided.

According to the present exemplary embodiment, the "underlayer" may be included on which the domain wall motion layer 10 with the excellent fcc (111) orientation can be grown to realize the preferable perpendicular magnetic anisotropy. The "underlayer" will be mainly described below.

Figure 5:
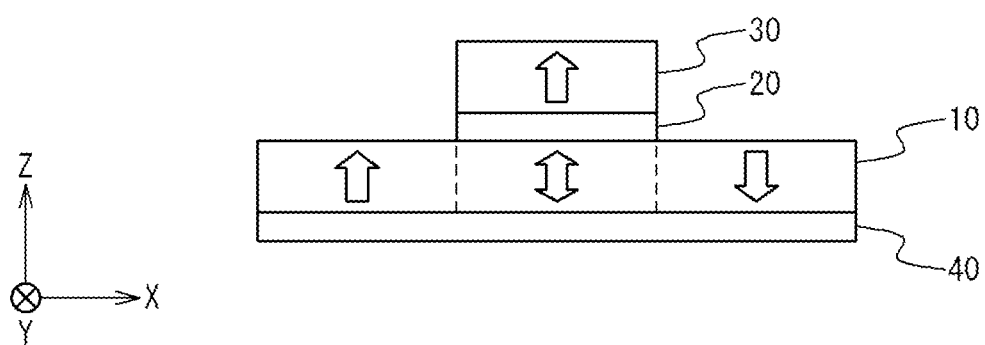
FIG. 5 is a side view showing a structure of a magnetoresistive effect element 70 to which an underlayer is applied according to the exemplary embodiment of the present invention.

FIG. 5 is a side view showing a structure of the magnetoresistive effect element 70 to which the underlayer is applied according to the exemplary embodiment of the present invention. The underlayer 40 is formed on the substrate side of the domain wall motion layer 10. The domain wall motion layer 10 is formed on the underlayer 40 by using the underlayer 40 as a ground layer.

The underlayer 40 may be a single layer or double layers. In the case of the single layer, material of the single layer contains: any of metals in the 9th to 11th groups having the fcc structure such as Cu, Rh, Pd, Ag, Ir, Pt, Au and so on; or an alloy composed of a plurality of material selected from the group consist of them. Here, even if material other than the above, whose content is in an appropriate range, is included, the present invention can be performed. By adding appropriate material, the adjustment can be carried out to obtain the desired performance further.

In the case of the double layers, material of a first underlayer (a lower side) contains any of elements in the 4th to 6th groups. That is, the first underlayer contains: any of metals in the 4th to 6th groups such as Ti, Zr, Nb, Mo, Hf, Ta, W and so on; or an alloy composed of a plurality of material selected from the group consist of them. Meanwhile, material of a second underlayer (an upper (domain wall motion layer 10) side) contains any of elements in the 9th to 11th groups. That is, the second underlayer contains: any of metals in the 9th to 11th groups having the fcc structure such as Cu, Rh, Pd, Ag, Ir, Pt, Au and so on; or an alloy composed of a plurality of material selected from the group consist of them. Incidentally, the first underlayer and the second underlayer are not required to be composed of a single metal of the above exemplified material, but may be composed of an alloy made of them. Here, even if material other than the above, whose content is in an appropriate range, is included, the present invention can be per formed. By adding appropriate material, the adjustment can be carried out to obtain the desired performance further.

The reason why the combination of the first underlayer and the second underlayer is preferable is as follows. First, a metal in the 4th to 6th groups used for the first underlayer grows as an amorphous film in the thin film thickness range, resulting in increase of surface energy. Therefore, the first underlayer can make the crystal growing on the first underlayer have the densest plane (the lowest surface energy plane) orientation. That is, when a metal in the 9th to 11th groups having the fcc structure used for the second underlayer grows on the first underlayer, the orientation of the (111) plane as the densest plane can be realized. The second underlayer functions as a template of the crystal orientation of the domain wall motion layer 10. As a result, the excellent fcc (111) orientation can be realized in the domain wall motion layer 10.

Particularly, focusing attention on the Co/Ni lamination film which has low saturation magnetization and high spin polarizability, when the lamination structure with the first underlayer and the second underlayer is provided as the preferable structure and material of the underlayer 40, the excellent performance can be obtained with respect to the Co/Ni lamination film.

Here, the inventor has now considered the following points. The inventor has considered that when the domain wall motion layer is made of ferromagnetic material with perpendicular magnetic anisotropy, if the spin polarizability of the domain wall motion layer is made larger than before, the writing current can be smaller than before. That is, by finding out the relationship between the spin polarizability and the perpendicular magnetic anisotropy (anisotropy magnetic field) in the domain wall motion layer to provide optimal perpendicular magnetic anisotropy (anisotropy magnetic field) for the domain wall motion layer, the spin polarizability is made larger than before, thereby enabling the writing current to be smaller than before.

As a result of the consideration, the inventor has found that the perpendicular magnetic anisotropy is preferably made to be at least in a certain range in order to reduce the writing current (the domain wall motion current) for causing the domain wall motion. When the perpendicular magnetic anisotropy is indicated by using the anisotropy magnetic field of the domain wall motion layer 10, the upper limit and the lower limit of the range are expressed below. The upper limit is the anisotropy magnetic field smaller than an essential value of an anisotropy magnetic field of the ferromagnetic material of the domain wall motion layer 10. The lower limit is the anisotropy magnetic field larger than a value in which the domain wall motion layer 10 can hold the perpendicular magnetic anisotropy.

As the upper limit, the anisotropy magnetic field of the domain wall motion layer 10 is smaller than the essential value of the anisotropy magnetic field of the ferromagnetic material of the domain wall motion layer 10. Here, the essential value of the anisotropy magnetic field of the material is a value of anisotropy magnetic field theoretically predicted based on physical properties (solid state properties) specific to the material. For example, in the case that the alternate lamination film made of material in transition metal systems is used for the domain wall motion layer 10, the value is a value of anisotropy magnetic field theoretically predicted by performing theoretical calculation (simulation) in consideration of physical properties specific to the material in transition metal systems, the lamination structure, ideal perpendicular magnetic anisotropy and the like. The spin polarizability is considered to become relatively higher if the value of the anisotropy magnetic field of the domain wall motion layer 10 becomes smaller than the essential value of the anisotropy magnetic field of the material. The reason is considered as follows.

It is known that the origin of the perpendicular magnetic anisotropy is the crystal magnetic anisotropy, the boundary magnetic anisotropy or the like. In the boundary magnetic anisotropy, there may be a case that the spin orbit interaction of d electrons having anisotropic electron orbits has the important role. Here, strengthening the perpendicular magnetic anisotropy corresponds to lowering the energy levels of the d electrons. Meanwhile, the domain wall motion current (the writing current) is controlled by the difference between the numbers of the positive and negative spins of the d electrons near the Fermi energy, which contribute to the conduction, namely the spin polarizability. Therefore, in the material with the high perpendicular magnetic anisotropy, the orbital energy of the d electrons decreases and falls below the Fermi energy, and thus the d electrons contributing to the conduction decrease. This makes the difference between the numbers of the positive and negative spins smaller, and consequently the spin polarizability decreases. According to the above description, in this case, by weakening the perpendicular magnetic anisotropy appropriately to increase the energy levels of the d electrons, the d electrons near the Fermi energy is made to increase, thereby enabling higher spin polarizability to be realized.

On the other hand, the anisotropy magnetic field of the perpendicular magnetic anisotropy of the domain wall motion layer 10 is larger than the value in which the domain wall motion layer 10 can hold the perpendicular magnetic anisotropy. That is, the anisotropy magnetic field of the domain wall motion layer 10 is required to be large enough to overcome a diamagnetic field described later and to make the magnetization oriented in the perpendicular direction. Here, the minimum value capable of holding the perpendicular magnetic anisotropy is a value of an anisotropy magnetic field where the domain wall motion layer 10 is in the side of the state having the perpendicular magnetic anisotropy, at the boundary between the states that the domain wall motion layer 10 has and does not have the perpendicular magnetic anisotropy. In addition, the state having the perpendicular magnetic anisotropy is a state where the magnetization direction of the domain wall motion layer 10 is oriented approximately in the ±z directions. Specifically, the ±z direction component of the magnetization direction of the domain wall motion layer 10 is larger than at least the ±x direction component and the ±y direction component (the both components are parallel to the substrate surface). The anisotropy magnetic field of the domain wall motion layer 10 taking such values is considered that the domain wall motion layer 10 of the current driven domain wall motion having the perpendicular magnetic anisotropy. In this case, as described in the non-patent literature 3 and the patent literature 3, the writing current can be reduced.

The above consideration has been confirmed based on experimental results (the first to fourth examples and the first to third comparison examples) as shown below. Next, the examples and the comparison examples will be described below.

FIG. 6 is a table showing a first example and its comparison example 1 of the present invention. The domain wall motion layers of the magnetoresistive effect element 70 are produced by a first deposition apparatus. In this table, the "domain wall motion layer" indicates the structure (the material, the film thickness and the number of layers) of the domain wall motion layer 10 used for the experiment. The "underlayer" indicates the structure (the material and the film thickness) of the underlayer 40 used for the experiment. The "Hk" indicates the measured value of the anisotropy magnetic field of the domain wall motion layer 10. The magnitude of the anisotropy magnetic field Hk substantially indicates the degree of the perpendicular magnetic anisotropy. Here, the measured value is a corrected value on which diamagnetic field correction is performed and $4\pi M_S$ (approximately 8 kOe, the $M_S$ is the saturation magnetization) is added to the saturation magnetic field H in the in-plane direction which is measured by the VSM (vibration sample magnet meter). This is because there is the relationship of $H=Hk-4\pi M_S$. The "Current" indicates the minimum value of the writing current necessary to cause the domain wall motion in the domain wall motion layer 10. The domain wall motion is detected as the change of the resistance value of the domain wall motion layer 10. The width of the magnetoresistive effect element 70 is 115 nm. The detailed of the experimental method is described in the non-patent literature 6 (T. Suzuki et al., "Evaluation of Scalability for Current-Driven Domain Wall Motion in a Co/Ni Multilayer Strip for Memory Applications", IEEE TRANSACTIONS ON MAGNETICS, VOL. 45, NO. 10, pp. 3776-3779, 2009). These are the same as those of FIGS. 7 and 8.

In the example 1, as the domain wall motion layer 10, the Co/Ni lamination film is used, in which the Co film with the film thickness of 0.3 nm and the Ni film with the film thickness of 0.6 nm are alternately laminated five layers each. As the underlayer 40, the Ta/Pt lamination film is used, in which the Ta film with the film thickness of 4 nm and the Pt film with the film thickness of 1.6 nm are laminated in this order. In this case, the anisotropy magnetic field Hk of the domain wall motion layer 10 is 14.3 kOe. In addition, the minimum value of the writing current which causes the domain wall motion is 0.4 mA.

In the comparison example 1, as the domain wall motion layer 10, similar to the example 1, the Co/Ni lamination film is used, in which the Co film with the film thickness of 0.3 nm and the Ni film with the film thickness of 0.6 nm are alternately laminated five layers each. As the underlayer 40, the Ta/Pt lamination film is used, in which the Ta film with the film thickness of 4 nm and the Pt film with the film thickness of 2.4 nm are laminated in this order. In this case, the anisotropy magnetic field Hk of the domain wall motion layer 10 is 15.2 kOe. In addition, the minimum value of the writing current which causes the domain wall motion is 0.7 mA.

In the comparison between the example 1 and the comparison example 1, the film thickness of the Pt film of the underlayer 40 is relatively thick (2.4 nm) in the comparison example 1. Therefore, the (111) orientation of the Pt film is considered to be high. As a result, the (111) orientation of the domain wall motion layer 10 is considered to be excellent, and thus the anisotropy magnetic field Hk (perpendicular magnetic anisotropy) is considered to be the essential value (approximately 15.2 kOe) of the material of the domain wall motion layer 10. Consequently, according to the above described reason, the minimum value of the writing current which causes the domain wall motion is relatively high (0.7 mA).

On the other hand, the film thickness of the Pt film of the underlayer 40 is relatively thin (1.6 nm) in the example 1. Therefore, the (111) orientation of the Pt film is relatively low. As a result, the (111) orientation of the domain wall motion layer 10 is considered to be relatively low, and thus the anisotropy magnetic field Hk (perpendicular magnetic anisotropy) is considered to be the low value (approximately 14.3 kOe) as compared with the essential value of the material of the domain wall motion layer 10. Consequently, according to the above described reason, the minimum value of the writing current which causes the domain wall motion is relatively low (0.4 mA).

When the domain wall motion layer 10 is the Co/Ni lamination film, to make the Co/Ni lamination film have the perpendicular magnetic anisotropy, the Co/Ni lamination film is required to have the (111) orientation. For that purpose, it is effective that the Pt film of the underlayer 40 is made to have the (111) orientation. Here, the Pt film on the Ta film has the (111) orientation if the film thickness is sufficiently thick. However, the Pt film on the Ta film does not have the (111) orientation if the film thickness is thin. In the present example, by using the Co/Ni lamination film with the imperfect (111) orientation, the perpendicular magnetic anisotropy is lowered, thereby reducing the domain wall motion current.

In this way, in the case of the example 1, by weakening the perpendicular magnetic anisotropy of the domain wall motion layer 10 lower than that in the essential state of the material, the writing current in which domain wall motion can arises can be reduced. That is, by lowering the value of the anisotropy magnetic field of the domain wall motion layer 10 as compared with the essential value of the material, the writing current in which domain wall motion can arises can be reduced.

FIG. 7 is a table showing a second example and its comparison example 2 of the present invention. The second example and the comparison example 2 are different from the case of FIG. 6 in that the domain wall motion layers are produced by a second deposition apparatus and the film thicknesses of the underlayer and the Pt film are thin, respectively, as compared with the case of FIG. 6.

In the example 2, as the domain wall motion layer 10, the Co/Ni lamination film is used, in which the Co film with the film thickness of 0.3 nm and the Ni film with the film thickness of 0.6 nm are alternately laminated five layers each. As the underlayer 40, the Ta/Pt lamination film is used, in which the Ta film with the film thickness of 4 nm and the Pt film with the film thickness of 1.0 nm are laminated in this order. In this case, the anisotropy magnetic field Hk of the domain wall motion layer 10 is 11.4 kOe. In addition, the minimum value of the writing current which causes the domain wall motion is 0.4 mA.

In the comparison example 2, as the domain wall motion layer 10, similar to the example 1, the Co/Ni lamination film is used, in which the Co film with the film thickness of 0.3 nm and the Ni film with the film thickness of 0.6 nm are alternately laminated five layers each. As the underlayer 40, the Ta/Pt lamination film is used, in which the Ta film with the film thickness of 4 nm and the Pt film with the film thickness of 1.6 nm are laminated in this order. In this case, the anisotropy magnetic field Hk of the domain wall motion layer 10 is 15.4 kOe. In addition, the minimum value of the writing current which causes the domain wall motion is 0.8 mA.

In the comparison between the example 2 and the comparison example 2, the film thickness of the Pt film of the underlayer 40 is relatively thick (1.6 nm) in the comparison example 2. Therefore, the (111) orientation of the Pt film is considered to be high. As a result, the (111) orientation of the domain wall motion layer 10 is considered to be high, and thus the anisotropy magnetic field Hk (perpendicular magnetic anisotropy) is considered to be the essential value (approximately 15.4 kOe) of the material of the domain wall motion layer 10. Consequently, according to the above described reason, the minimum value of the writing current which causes the domain wall motion is relatively high (0.8 mA).

On the other hand, the film thickness of the Pt film of the underlayer 40 is relatively thin (1.0 nm) in the example 2. Therefore, the (111) orientation of the Pt film is considered to be relatively low. As a result, the (111) orientation of the domain wall motion layer 10 is considered to be relatively low, and thus the anisotropy magnetic field Hk (perpendicular magnetic anisotropy) is considered to be the low value (approximately 11.4 kOe) as compared with the essential value of the material of the domain wall motion layer 10. Consequently, according to the above described reason, the minimum value of the writing current which causes the domain wall motion is relatively low (0.4 mA).

The result of FIG. 6 does not coincide with the result of FIG. 7. However, it is considered that this is caused by the production condition difference due to the apparatus difference. Even in the present example, by using the Co/Ni lamination film with the imperfect (111) orientation, the perpendicular magnetic anisotropy is lowered, thereby reducing the domain wall motion current. This tendency is the same as the results of the example 1 and the comparison example 1.

In this way, in the case of the example 2, by weakening the perpendicular magnetic anisotropy of the domain wall motion layer 10 lower than that in the essential state of the material, the writing current in which domain wall motion can arises can be reduced. That is, by lowering the value of the anisotropy magnetic field of the domain wall motion layer 10 as compared with the essential value of the material, the writing current in which domain wall motion can arises can be reduced.

Figure 1:
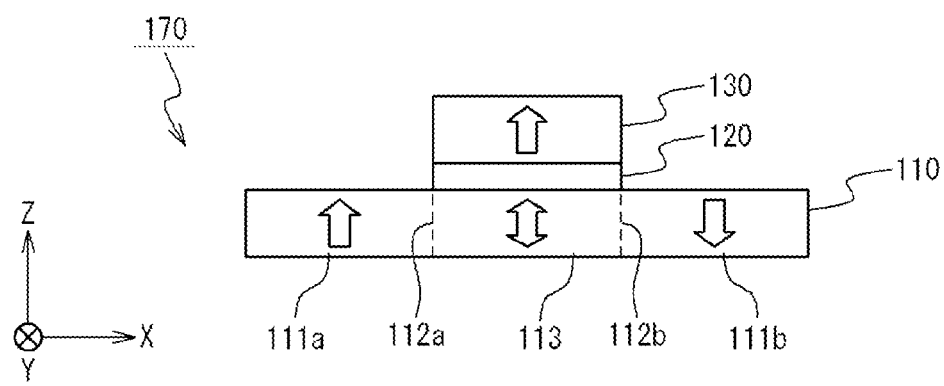
FIG. 1 is a sectional view schematically showing a magnetoresistive effect element in the International Publication WO/2009/001706.

FIG. 8 is a table showing a third and fourth examples and their comparison example 3 of the present invention. The basic structures of the third and fourth examples and their comparison example 3 are the same as that of the example 1 of FIG. 1. However, they are different from that of the example 1 of FIG. 1 in that a cap layer is laminated on the surface of the domain wall motion layer 10, which is the opposite side surface to the underlayer 40.

That is, in the example 3, the Ru film with the film thickness of 2.0 nm as the cap layer is laminated on the structure of the example 1 of FIG. 6. In this case, the anisotropy magnetic field Hk of the domain wall motion layer 10 is 13.4 kOe, which is reduced as compared with the case of the example 1. In addition, in this case, the minimum value of the writing current in which the domain wall motion arises is 0.3 mA, which is reduced as compared with the case of the example 1. That is, by using the Ru film as the cap layer, the writing current in which the domain wall motion arises can be further reduced. It is considered because, in the boundary between the Ru film and the domain wall motion layer, the influence of the boundary magnetic anisotropy is changed, thereby reducing the perpendicular magnetic anisotropy.

In the example 4, the Pt film with the film thickness of 2.0 nm as the cap layer is laminated on the structure of the example 1 of FIG. 6. In this case, the anisotropy magnetic field Hk of the domain wall motion layer 10 is 14.3 kOe, which is not changed as compared with the case of the example 1. In addition, in this case, the minimum value of the writing current in which the domain wall motion arises is 0.4 mA, which is not changed as compared with the case of the example 1. That is, by even using the Pt film as the cap layer, the writing current in which the domain wall motion arises is not changed. It is considered because, in the boundary between the Pt film and the domain wall motion layer, the influence of the boundary magnetic anisotropy is not changed.

On the other hand, in the comparison example 3, the MgO film with the film thickness of 1.0 nm as the cap layer is laminated on the structure of the example 1 of FIG. 6. In this case, the anisotropy magnetic field Hk of the domain wall motion layer 10 is 15.7 kOe, which is increased as compared with the case of the example 1. In addition, in this case, the minimum value of the writing current in which the domain wall motion arises is 0.8 mA, which is increased as compared with the case of the example 1. That is, by using the MgO film as the cap layer, the writing current in which the domain wall motion arises is increased reversely. It is considered because, in the boundary between the MgO film and the domain wall motion layer, the influence of the boundary magnetic anisotropy is changed, thereby improving the perpendicular magnetic anisotropy.

In this way, in the case of the example 3, by laminating the cap layer, the perpendicular magnetic anisotropy of the domain wall motion layer 10 is weakened lower than that of the essential state of the material, thereby enabling the writing current in which domain wall motion can arises to be reduced further. That is, by lowering the value of the anisotropy magnetic field of the domain wall motion layer 10 as compared with the essential value of the material, the writing current in which domain wall motion can arises can be reduced further.

Figure 9:
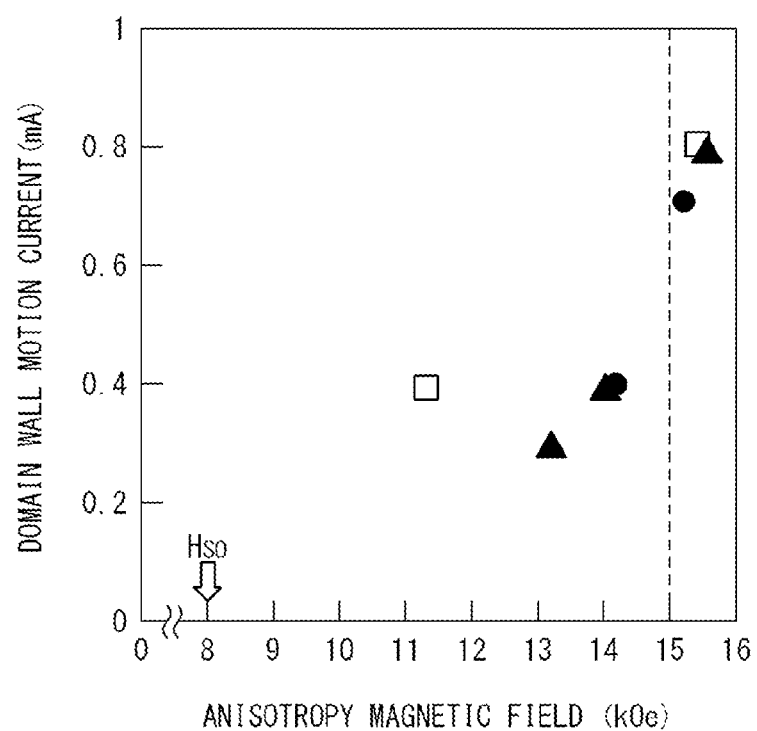
FIG. 9 is a graph showing results of the first to fourth examples and the first to third comparison examples of the present invention.

FIG. 9 is a graph showing results of the first to fourth examples and the first to third comparison examples of the present invention. The vertical axis indicates the domain wall motion current (the minimum value of the writing current in which the domain wall motion arises), and the horizontal axis indicates the anisotropy magnetic field Hk (corresponding to the perpendicular magnetic anisotropy). Here, as described above, $Hk=H+4\pi M_S$ (approximately 8 kOe). In FIG. 9, $4\pi M_S$ is indicated as $H_{SO}$. The solid circles indicate the example 1 and the comparison example 1. The open squares indicate the example 2 and the comparison example 2. The solid triangles indicate the examples 3, 4 and the comparison example 3.

As compared with in the domain wall motion layer having the anisotropy magnetic field of the essential value (15 kOe to 16 kOe), in the domain wall motion layer having the small anisotropy magnetic field, the domain wall motion current is decreased. It is considered because the perpendicular magnetic anisotropy of the domain wall motion layer 10 is weakened smaller than that in the essential state of the material. As a result, in the range that the anisotropy magnetic field is smaller than 15 kOe, as compared with the case of the domain wall motion layer having the essential perpendicular magnetic anisotropy, the domain wall motion current can be reduced. Meanwhile, to retain the perpendicular magnetic anisotropy, the anisotropy magnetic field is required to be larger than $4\pi M_S$ (approximately 8 kOe). Therefore, the anisotropy magnetic field is required to be larger than 8 kOe. According to the above description, it is preferable that the anisotropy magnetic field is larger than 8 kOe and smaller than 15 kOe.

Here, in the Co/Ni lamination film, when the anisotropy magnetic field (the perpendicular magnetic anisotropy) is the essential value, the degree of the (111) orientation is considered to be approximately 100%. Therefore, to weaken the perpendicular magnetic anisotropy of the domain wall motion layer 10 from that in the essential state of the material, the degree of the (111) orientation is preferably lower than 100%. In this case, as for the underlayer 40, the degree of the (111) orientation is also preferably lower than 100%.

On the other hand, in the Co/Ni lamination film, to retain the perpendicular magnetic anisotropy, the degree of the (111) orientation is required to be larger than the degree of the orientation that the perpendicular magnetic anisotropy can be retained. Here, the degree of the orientation that the perpendicular magnetic anisotropy can be retained is a degree of the orientation that the ratio of the crystals oriented in the (111) direction in the Co/Ni lamination film is higher than the ratio of the crystals oriented in the (111) direction in the random orientation film. In this case, as for the underlayer 40, the degree of the (111) orientation is also required to be larger than the degree of the orientation that the perpendicular magnetic anisotropy can be retained in the Co/Ni lamination film. The degree of the orientation is substantially similar to the degree of the orientation of the Co/Ni lamination film According to the above description, it is preferable that the degree of the (111) orientation in the Co/Ni lamination film (the domain wall motion layer 10) is larger than the degree of the orientation that the Co/Ni lamination film can retain the perpendicular magnetic anisotropy and smaller than the orientation of 100%.

As the method of weakening the perpendicular magnetic anisotropy of the domain wall motion layer 10 from that in the essential state of the material, namely, as the method of lowering the anisotropy magnetic field of the domain wall motion layer 10 from that of the essential value of the material, the above examples focus attention on the crystal orientation (e.g., the (111) orientation of the Co/Ni). By controlling the crystal orientation of the underlayer 40 adjusting its film thickness, the crystal orientation of the domain wall motion layer 10 is controlled. However the present invention is not limited to these examples and other methods can be applied if the perpendicular magnetic anisotropy of the domain wall motion layer 10 can be weakened from that in the essential state of the material.

For example, as the other method, the material having a long-period structure is applied to the underlayer 40. Here, the long-period structure is defined as a structure having an orientation plane such as (664) which is slightly declined from (111). According to this, it is considered that, since the crystal orientation of the domain wall motion layer 10 is degraded, the anisotropy magnetic field can be lowered from the essential value of the material.

As the other method, for example, a method that another element is added to the domain wall motion layer 10 can be considered. According to this, it is considered that, since the crystal orientation of the domain wall motion layer 10 is degraded, the anisotropy magnetic field can be lowered from the essential value of the material. As for the other element, it is considered that, for example, a small amount of non-magnetic material. As for the non-magnetic material, Ta and Cu are exemplified.

As the other method, a method that an appropriate thermal treatment is performed can be considered. According to this, it is considered that, by generating disorder of the crystal property or the interdiffusion at the boundary between the domain wall motion layer 10 and the underlayer 40, the boundary magnetic anisotropy is affected, thereby reducing the perpendicular magnetic anisotropy.

While the invention has been particularly shown and described with reference to exemplary embodiments (including several examples) thereof, the invention is not limited to these exemplary embodiments. It will be understood by those of ordinary skill in the art that various changes in form and details may be made therein without departing from the spirit and scope of the present invention as defined by the claims.

Although the present invention has been described above in connection with several exemplary embodiments (including several examples) thereof, it would be apparent to those skilled in the art that those exemplary embodiments (including several examples) are provided solely for illustrating the present invention, and should not be relied upon to construe the appended claims in a limiting sense.

This application is based upon and claims the benefit of priority from Japanese patent application No. 2009-292171 filed on Dec. 24, 2009, the disclosure of which is incorporated herein in its entirety by reference.

The invention claimed is:

1. A magnetoresistive effect element, comprising:
an underlayer including a Ta film and a Pt film formed on an upper surface of the Ta film;
a domain wall motion layer formed on the Pt film and including a Co/Ni lamination film with Co films and Ni films alternatingly laminated, the Co/Ni lamination film being formed directly on the Pt film, the domain wall motion layer having perpendicular magnetic anisotropy;
a spacer layer formed on an upper surface of the domain wall motion layer and made of non-magnetic material; and
a reference layer formed on an upper surface of the spacer layer and made of ferromagnetic material, magnetization of the reference layer being fixed,
wherein the domain wall motion layer includes at least one domain wall, and stores data corresponding to a position of the domain wall,
a thickness of the Pt film is 1.6 nm or less,
the Co/Ni lamination film has a Co film thickness of 0.3 nm and a Ni film thickness of 0.6 nm,
the Ta film has a thickness of 4 nm, and
an anisotropy magnetic field of the domain wall motion layer is larger than 8 kOe and smaller than 15 kOe.

2. The magnetoresistive effect element according to claim 1, wherein a degree of (111) orientation of the Co/Ni lamination film is larger than a degree in which the Co/Ni lamination film can hold the perpendicular magnetic anisotropy and smaller than 100%.

3. The magnetoresistive effect element according to claim 2, wherein a degree of (111) orientation of the Pt film is larger than a degree in which the Co/Ni lamination film can hold the perpendicular magnetic anisotropy and smaller than 100%.

4. The magnetoresistive effect element according to claim 1, wherein the Co/Ni lamination film has a Co film thickness of 0.3 nm and a Ni film thickness of 0.6 nm, and
the Ta film has a thickness of 4 nm and the Pt film has a thickness of 1.6 nm, and
wherein the anisotropy magnetic field of the domain wall motion layer is 14.3 kOe, and a minimum value of a writing current which causes domain wall motion is 0.4 mA.

5. The magnetoresistive effect element according to claim 1, wherein the Co/Ni lamination film has a Co film thickness of 0.3 nm and a Ni film thickness of 0.6 nm, and
the Ta film has a thickness of 4 nm and the Pt film has a thickness of 1.0 nm, and
wherein the anisotropy magnetic field of the domain wall motion layer is 11.4 kOe, and a minimum value of a writing current which causes domain wall motion is 0.4 mA.

6. The magnetoresistive effect element according to claim 1, wherein a degree of (111) orientation of the Co/Ni lamination film is larger than a degree in which the Co/Ni lamination film can hold the perpendicular magnetic anisotropy and smaller than 100%.

7. A magnetic random access memory comprising:
a plurality of magnetic memory cells each including a magnetoresistive effect element,
wherein the magnetoresistive effect element includes:
an underlayer including a Ta film and a Pt film formed on an upper surface of the Ta film;
a domain wall motion layer formed on the Pt film and including a Co/Ni lamination film with Co films and Ni films alternatingly laminated, the Co/Ni lamination film being formed directly on the Pt film, the domain wall motion layer having perpendicular magnetic anisotropy,
a spacer layer formed on an upper surface of the domain wall motion layer and made of non-magnetic material, and a reference layer formed on an upper surface of the spacer layer and made of ferromagnetic material, magnetization of the reference layer being fixed, wherein the domain wall motion layer includes at least one domain wall, and stores data corresponding to a position of the domain wall, wherein a thickness of the Pt film is 1.6 nm or less, the Co/Ni lamination film has a Co film thickness of 0.3 nm and a Ni film thickness of 0.6 nm, the Ta film has a thickness of 4 nm, and wherein an anisotropy magnetic field of the domain wall motion layer is larger than 8 kOe and smaller than 15 kOe.

8. The magnetic random access memory according to claim 7, wherein a degree of (111) orientation of the Co/Ni lamination film is larger than a degree in which the Co/Ni lamination film can hold the perpendicular magnetic anisotropy and smaller than 100%.

9. The magnetic random access memory according to claim 8, wherein a degree of (111) orientation of the Pt film is larger than a degree in which the Co/Ni lamination film can hold the perpendicular magnetic anisotropy and smaller than 100%.

* * * * *